United States Patent [19]

Endo et al.

[11] Patent Number: 4,642,461
[45] Date of Patent: Feb. 10, 1987

[54] FIELD EMISSION TYPE ELECTRON MICROSCOPE USING A MULTI-STAGE ACCELERATION TUBE

[75] Inventors: Junji Endo, Kokubunji; Akira Tonomura, Koganei; Susumu Ozasa, Kashiwa; Tsuyoshi Matsuda, Tokyo; Chikara Kimura, Katsuta; Nobuyuki Osakabe, Kokubunji, all of Japan

[73] Assignee: Hitachi, Ltd., Tokyo, Japan

[21] Appl. No.: 676,313

[22] Filed: Nov. 29, 1984

[30] Foreign Application Priority Data

Nov. 30, 1983 [JP] Japan ................................ 58-224095

[51] Int. Cl.$^4$ ............................................ G01N 23/00
[52] U.S. Cl. .................................. 250/311; 313/363.1
[58] Field of Search ............................ 250/306, 311; 313/363.1

[56] References Cited

U.S. PATENT DOCUMENTS

| 3,691,377 | 9/1972 | Matsui et al. | 250/311 |
| 3,760,180 | 9/1973 | Weber | 250/311 |
| 3,946,268 | 3/1976 | Welter | 250/311 |
| 4,160,905 | 7/1979 | Davey | 250/311 |
| 4,274,035 | 6/1981 | Fukuhara et al. | 250/311 |

Primary Examiner—Bruce C. Anderson
Attorney, Agent, or Firm—Antonelli, Terry & Wands

[57] ABSTRACT

A field emission type electron microscope using a multi-stage acceleration tube wherein an acceleration voltage to be applied to at least one, always inclusive of a first-stage acceleration electrode, of acceleration electrodes is changed in interlocked relationship with a change in a field emission voltage to be applied to a field emission electrode, so that power of an electrostatic lens can be kept constant.

6 Claims, 6 Drawing Figures

FIELD EMISSION TYPE ELECTRON MICROSCOPE USING A MULTI-STAGE ACCELERATION TUBE

BACKGROUND OF THE INVENTION

This invention relates to a field emission type electron microscope using a multi-stage acceleration tube wherein a field-emitted electron beam is subjected to multi-stage acceleration so as to impinge on a specimen, and an image of the specimen based on transmitted electrons, reflected electrons or secondary electrons generated from the specimen is observed.

A prior art and problems encountered therein will first be described with reference to FIG. 1 illustrating a prior art field emission type electron microscope using a three-stage acceleration tube as disclosed in Physical Revies B, Vol. 25, No. 11, 1982, pp. 6799 to 6804. The electron microscope illustrated in FIG. 1 comprises a multi-stage acceleration tube 1, an electron gun chamber 2, an intermediate chamber 3, a condenser chamber 4, a deflection coil 5, a condenser lens 6, ion pumps 7 and 8, a valve 9, a field emission cathode 10, a field emission electrode 11, acceleration electrodes 12 to 14, outer protective electrodes 15 to 17, differential evacuation apertures 18 and 19, a power box 20, a field-emission power source 21, a flashing power source 23, a power box 24, an acceleration power source 25, a reference resistor 26, an acceleration-voltage stabilizing circuit 27, high voltage cables 28 and 29, and dividing resistors 31 to 33. A specimen chamber and lower components contiguous thereto are not illustrated.

A high voltage power supply for applying a high voltage to the electron gun chamber 2 includes the power box 20, field-emission power source 21 and flashing power source 23 and it is connected to the electron gun chamber through the high voltage cables 28 and 29. An acceleration voltage $V_0$ applied to the field emission cathode 10 is grounded through the dividing resistors 31 to 33. Accordingly, divisional voltages proportional to dividing ratios of the respective dividing resistors are applied to the respective acceleration electrodes 12 to 14. Applied to the field emission electrode 11 is a field emission voltage $V_1$ from the field-emission power source 21.

Under this condition, an electrostatic lens formed within the multi-stage acceleration tube 1 has a characteristic which is substantially determined by a ratio $V_2/V_1$ between a first-stage acceleration voltage $V_2$ applied across the field emission cathode 10 and first-stage acceleration electrode and the field emission voltage $V_1$. The field emission cathode 10 must be subjected to heat treatment for its activation by means of the flashing power source 23 each time microscopic observation is carried out, and such a heat treatment gradually increases the radius of curvature of the tip of cathode 10 at the rate of a small amount. Therefore, to obtain the same amount of total field emission current throughout repetitions microscopic observation, the field emission voltage $V_1$ must be increased little by little. It is also necessary that the acceleration voltage $V_0$ be varied dependent on the condition for microscopic observation and the kind of specimen. When the field emission voltage $V_1$ and/or the acceleration voltage $V_0$ varies, the value of the parameter $V_2/V_1$ indicative of the electrostatic lens characteristic also varies with the result that such electron optics characteristics as position of an imaginary light source and magnitude of aberration cannot be kept constant. Especially, when the field emission voltage $V_1$ increases and/or the acceleration voltage $V_0$ decreases, the value of $V_2/V_1$ is decreased to weaken power of the electrostatic lens and as a result, the electron beam diverges within the multi-stage acceleration tube 1. Since, in the case of multi-stage acceleration tube, the distance between the field emission electrode 11 and the differential evacuation aperture 18 or 19 is long, the amount of electron beam passing through the differential evacuation apertures 18 and 19 will be decreased considerably unless a beam of electrons being approximately collimated is used. The field emission voltage $V_1$ is usually changed, in use, over a range of from 3 KV to 7 KV but the formation of an approximately collimated electron beam is allowed within only a voltage change of about 0.5 KV. Therefore, each time the field emission voltage $V_1$ is varied by 0.5 KV, the distance between the field emission cathode 10 and the field emission electrode 11 must be adjusted such that an approximately collimated electron beam can be obtained.

The prior art field emission type electron microscope using a multi-stage acceleration tube faces the problems described above and its electron optics system of electron gun needs frequent adjustments, which imposes grave problems on easiness of operation and stability of performance.

SUMMARY OF THE INVENTION

An object of this invention is to solve the prior art problems and to provide a field emission type electron microscope using a multi-stage acceleration tube which can maintain a substantially invariable electron optics characteristic to produce bright images even when the conditions for the operation of electron gun such as the field emission voltage and acceleration voltage vary.

According to the invention, the above object can be accomplished by a field emission type electron microscope using a multi-stage acceleration tube comprising a field emission cathode, a field emission electrode for causing field emission of electrons from the cathode, two or more stages of acceleration electrodes for accelerating an electron beam passing through an aperture formed in the field emission electrode, and application voltage interlocking means for changing an acceleration voltage to be applied to at least one, always inclusive of a first-stage acceleration electrode, of the acceleration electrodes in interlocked relationship with a change in a field emission voltage to be applied to the field emission electrode.

DESCRIPTION OF THE PREFERRED EMBODIMENTS

Figure 1:
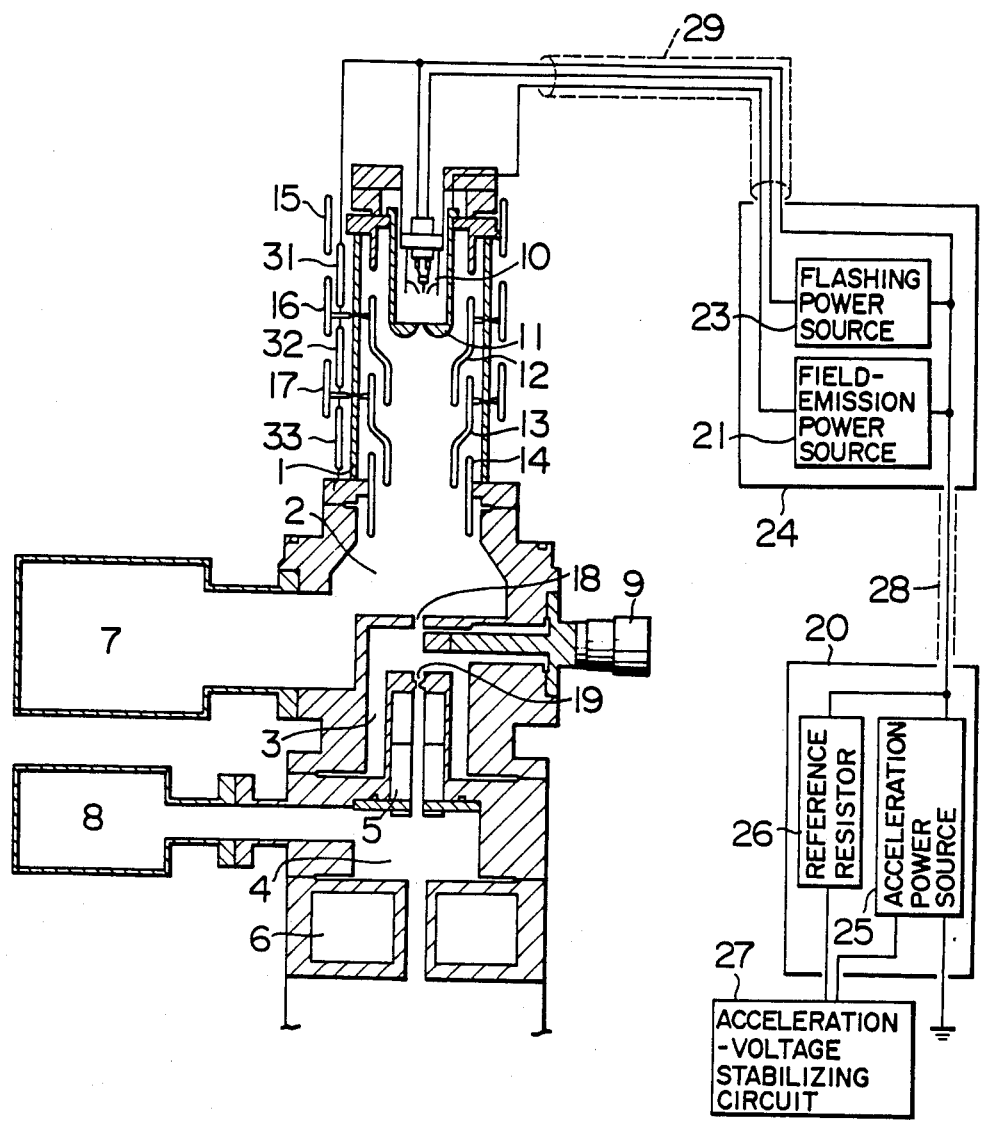
FIG. 1 is a schematic view showing a longitudinal section of a prior art illuminating system and a power supply unit therefor.
Figure 2:
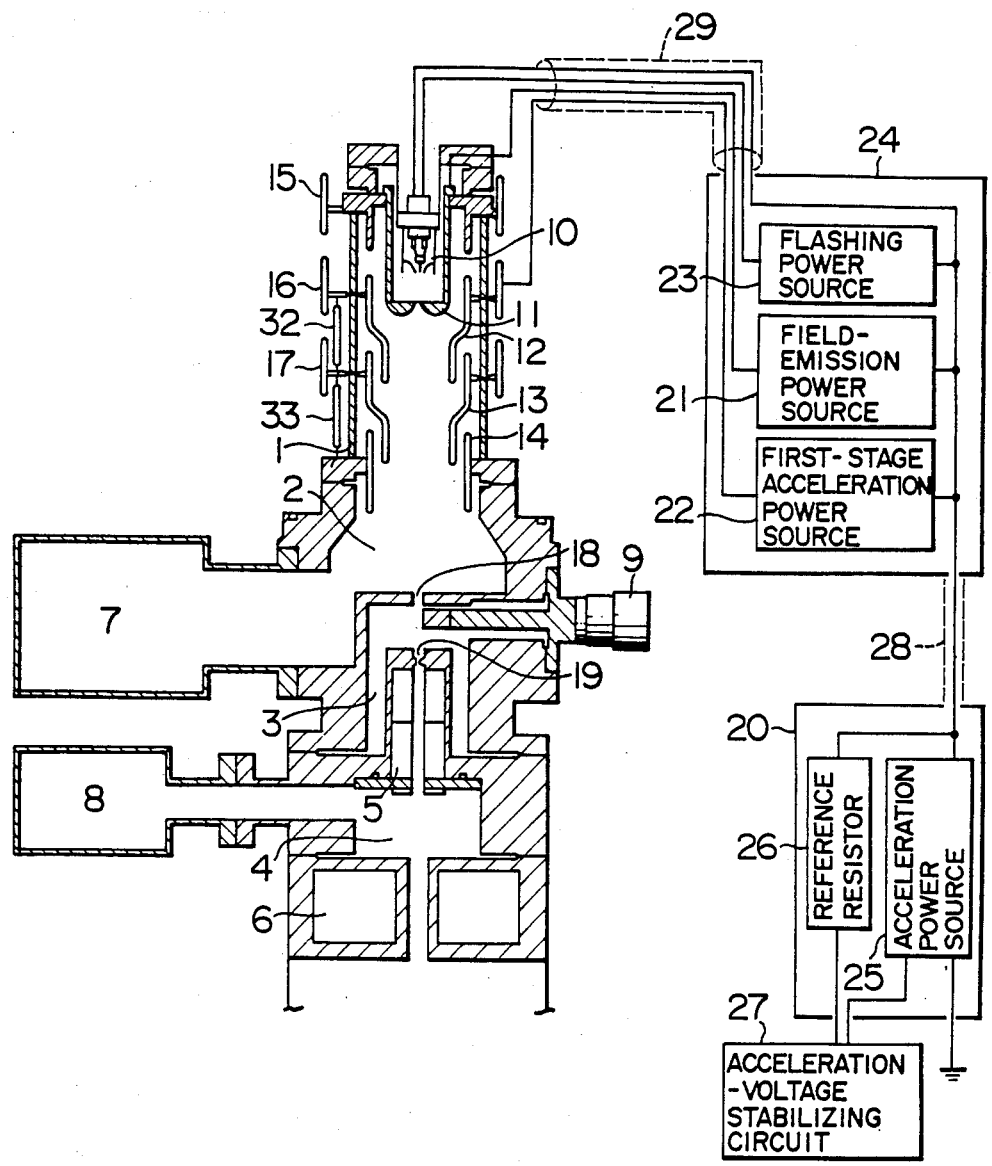
FIGS. 2 to 6 are schematic diagrams showing, in longitudinal sectional form, different illuminating systems according to embodiments of the invention and power supply units therefor.

FIG. 2 schematically shows an illuminating system of a field emission type electron microscope using a multi-stage acceleration tube and a power supply unit therefor according to a first embodiment of the present invention. This embodiment structurally differs from the prior art example of FIG. 1 in that a first-stage acceleration power source 22 is added in a power box 24. To describe the arrangement in greater detail, the illuminating system comprises an electron gun chamber 2, an intermediate chamber 3 and a condenser chamber 4 which are evacuated by vacuum pumps such as ion pumps 7 and 8 to $10^{-8}$ Pa, $10^{-6}$ Pa and $10^{-4}$ Pa, respectively. A multi-stage acceleration tube 1 has a vacuum-proof structure wherein three cylindrical members of ceramic are stacked through spacers of Kovar (trade name). A field emission electrode 11 and acceleration electrodes 12 to 14 are mounted interiorly of the tube 1 and outer protective electrodes 15 to 17 are mounted exteriorly of the tube 1. The acceleration electrodes 12 to 14 are interconnected through dividing resistors 32 and 33. A field emission cathode 10 is connected to a top flange of the multi-stage acceleration tube 1. The multi-stage acceleration tube 1 is surrounded by atmosphere of high insulating gas such as freon.

The power supply unit comprises a power box 20 for generating a negative high voltage $V_0$ for acceleration of an electron beam, and the power box 24 for electrically isolating a field-emission power source 21 and the first-stage acceleration power source 22 from the negative high voltage $V_0$. The acceleration voltage $V_0$ generated from an acceleration power source 25 and stabilized by means of a reference resistor 26 and an acceleration-voltage stabilizing circuit 27 is applied to the field emission cathode 10 through high voltage cable 28, power box 24 and high voltage cable 29. A flashing power source 23 is connected across leads of a filament of the field emission cathode 10. The field-emission power source 21 and first-stage acceleration power source 22 respectively generate high voltages $V_1$ (3 to 7 KV) and $V_2$ (20 to 60 KV), positive relative to the field emission cathode 10, which are applied to the electrodes 11 and 12, respectively. The acceleration electrode 14 is grounded through an electron microscope column, and the acceleration electrode 13 is applied with a divisional voltage which is determined by dividing a voltage ($V_0-V_2$) in accordance with a dividing ratio between the dividing resistors 32 and 33.

With the above construction, an electron beam drawn out of the field emission cathode 10 by the field emission voltage $V_1$ is passed through an electrode aperture formed in the field emission electrode 11 and accelerated by the acceleration electrodes 12 to 14 to have energy of a predetermined level. The electron beam then passes through differential exhausting apertures 18 and 19 as well as a deflection coil 5 and a condenser lens 6 to impinge on a specimen. Under this condition, the electron gun has an electron optics characteristic which is substantially determined by a ratio $V_2/V_1$ between the first-stage acceleration voltage $V_2$ and the field emission voltage $V_1$.

Then, according to the first embodiment, a primary side control voltage of a transformer included in a high voltage generator for the first-stage acceleration power source 22 is generated in accordance with the magnitude of a primary side control voltage of a transformer included in a high voltage generator circuit (CW circuit) for the field-emission power source 21, to ensure that upon changing the field emission voltage $V_1$, the first-stage acceleration voltage $V_2$ can be varied in proportion to a change in the field emission voltage $V_1$. In this case, the proportional constant $k=V_2/V_1$ is made variable within a range of from 6 to 15.

The amount of electron beam emitted from the electron gun is substantially limited by the differential exhausting aperture 18. Accordingly, if an electrostatic lens is formed which can shape the electron beam coming from the field emission electrode 11 into a substantially collimated form, the amount of electron beam blocked or shut by the differential exhausting aperture 18 will be decreased. Under a condition of $V_2/V_1<6$, it is difficult to obtain an approximately collimated electron beam whatever electrode structure may be. Incidentally, the field emission voltage $V_1$ preferably ranges from 4 KV to 6 KV. But under a condition of $V_2/V_1>15$, $V_2>(60$ to $90)$ KV results and this value of $V_2$ is too large to be used for practical purposes.

For these reasons, by interlocking the first-stage acceleration power source 22 with the field-emission power source 21 so that $V_2/V_1$ equals 6 to 15, such electron optics characteristics as position of an imaging light source, magnitude of aberration and spot size can be made invariable over substantially the entire allowable range of from 3 KV to 7 KV of the field emission voltage $V_1$.

For the purpose of interlocking the first-stage acceleration power source 22 with the field-emission power source 21, it may be conceivable that the primary side control voltage of the transformer included in the high voltage generator circuit for the field emission power source 21 is applied, directly or after being divided by resistors, to the primary side of the transformer included in the high voltage generator circuit for the first-stage acceleration power source 22, that the field emission voltage $V_1$ is derived out of an intermediate stage of output stages of the high voltage generator circuit for the first-stage acceleration power source 22, whereby the field-emission power source 21 can be dispensed with, and that the primary side control voltages of the transformers included in the high voltage generator circuits for the field emission power source 21 and first-stage acceleration power source 22 are simultaneously adjusted by means of a multi-stage rotary switch or variable resistor connected to control voltage setters for the transformers. Alternatively, to attain the same effect, the field-emission power source 21 may be made electrically independent of the first-stage acceleration power source 22 and the first-stage acceleration voltage $V_2$ may be manually interlocked with the field emission voltage $V_1$. Further, each of the dividing resistors 32 and 33 may be replaced with a series connection of a constant voltage element such as a Zener diode and a resistor.

Figure 3:
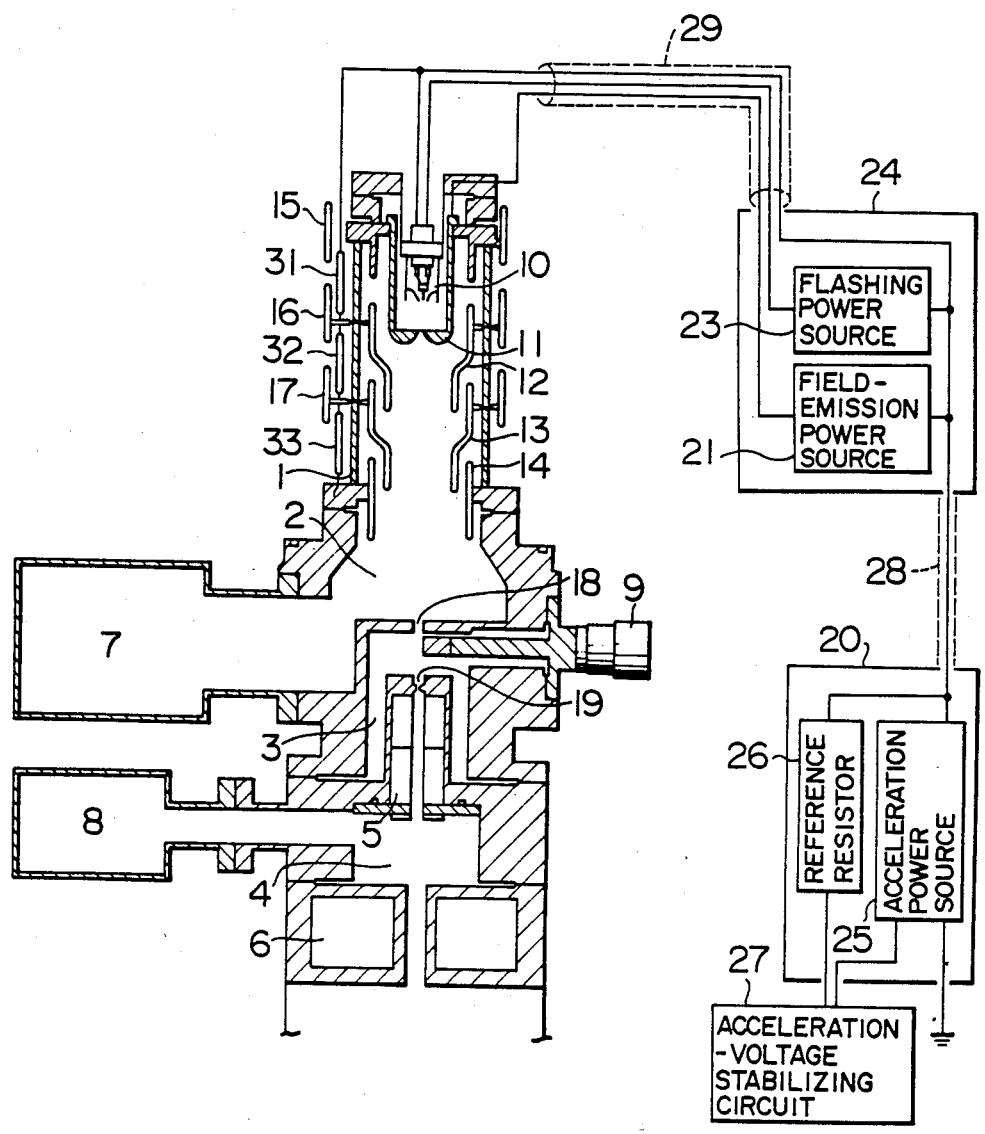

FIG. 3 shows a second embodiment of the invention which is identical with the FIG. 1 prior art example with the only exception that the internal structure of dividing resistors 31 to 33 is different from that of the corresponding resistors in FIG. 1. More particularly, in the embodiment of FIG. 3, resistances of the dividing resistors 31 to 33 are varied to change the voltage $V_2$ applied to the first-stage acceleration electrode 12 such that the ratio $V_2/V_1$ between first-stage acceleration voltage $V_2$ and field emission voltage $V_1$ can be kept constant. Letting resistances of the respective dividing resistors 31 to 33 be $R_{31}$ to $R_{33}$, a divisional voltage $V_2$ applied across the field emission cathode 10 and the first-stage acceleration electrode 12 is given by $$V_2 = V_0 R_{31}/(R_{31}+R_{32}+R_{33}).$$

Thus, by selecting the resistances $R_{31}$ to $R_{33}$ such that the ratio $V_2/V_1$ measures a predetermined value falling within a range of from 6 to 15 when the field emission voltage $V_1$ and the acceleration voltage $V_0$ change, the electron optics characteristics of the electron gun can be kept constant.

Figure 4:
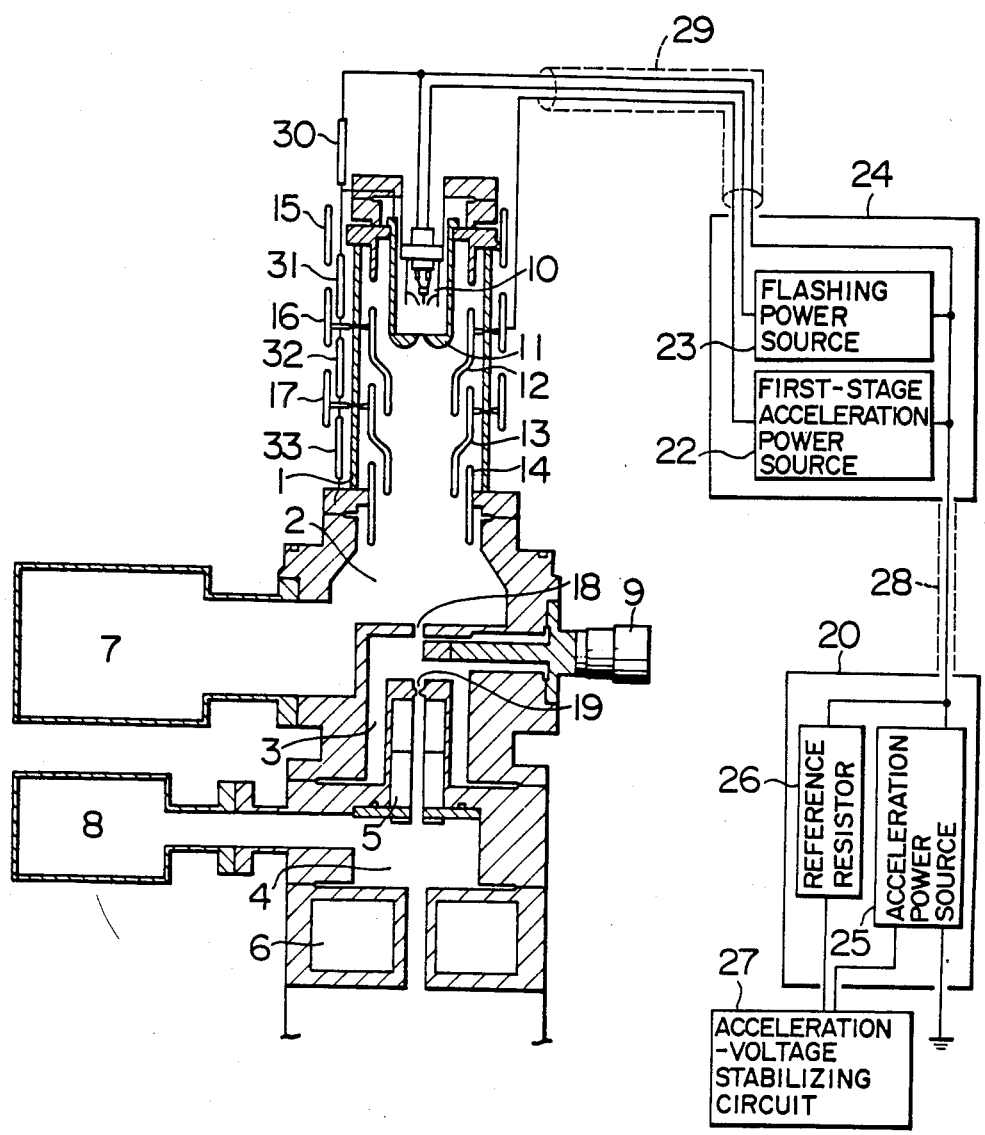

FIG. 4 shows a third embodiment of the invention wherein a first-stage acceleration voltage $V_2$ is applied across a field emission electrode 10 and a first-stage acceleration electrode 12, a dividing resistor 30 is connected between the field emission cathode 10 and a field emission electrode 11, and a dividing resistor 31 is connected between the field emission electrode 11 and the first-stage acceleration electrode 12. With this construction, the first-stage acceleration voltage $V_2$ is divided to provide a field emission voltage $V_1$. Letting the resistance of the dividing resistor 30 be $R_{30}$, the field emission voltage $V_1$ divided from the first-stage acceleration voltage $V_2$ and applied to the field emission electrode 11 is given by $$V_1 = V_2 R_{30}/(R_{30}+R_{31}).$$

Accordingly, by selecting the resistances $R_{30}$ and $R_{31}$ such that $$V_2/V_1 = (R_{30}+R_{31})/R_{30}$$

measures a predetermined value falling within the range of from 6 to 15, the electron optics characteristics of the electron gun can be kept constant.

Figure 5:
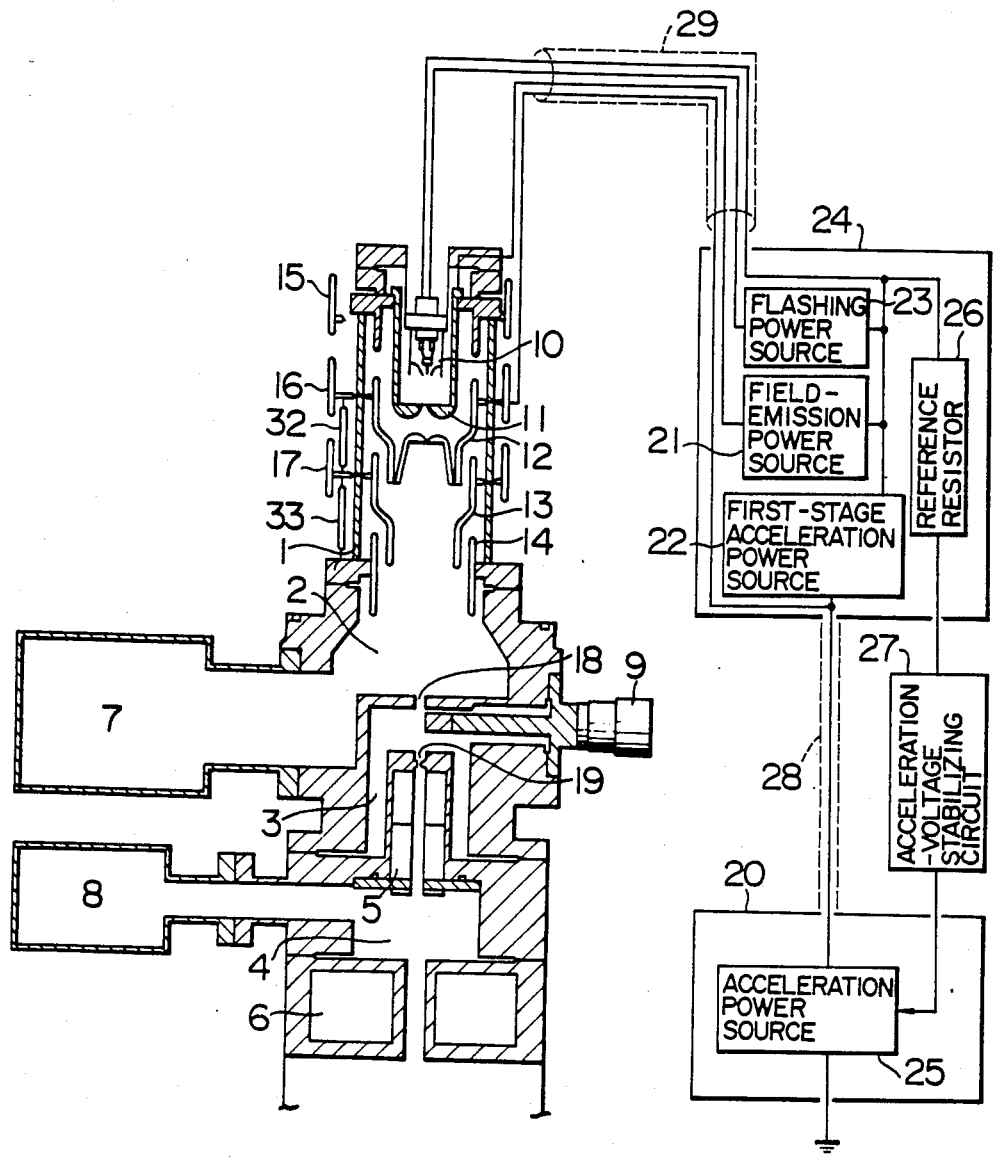

FIG. 5 shows a fourth embodiment of the invention which is featured, in the first place, by its power supply unit. More specifically, an acceleration power source 25 is connected in series with a first-stage acceleration power source 22, whereby the sum of high voltages from both the power sources is used as an acceleration voltage $V_0$ to be applied to a field emission cathode 10, and a first-stage acceleration electrode 12 is applied with a voltage $(V_0-V_2)$ from the acceleration power source 25. To stabilize the acceleration voltage, the total output voltage of the power sources 22 and 25 is connected to a reference resistor 26 so that the output of an acceleration-voltage stabilizing circuit 27 is negative feedback to the acceleration power source 25. Since a field emission power source 21 is interlocked with the first-stage acceleration power source 22 in a similar manner to the foregoing embodiments, a change in first-stage acceleration voltage $V_2$ caused in compliance with a change in field emission voltage $V_1$ is cancelled out by a change in output voltage of the acceleration power source 25, thereby ensuring that the total acceleration voltage $V_0$ and, of course, the ratio $V_2/V_1$ can be kept constant. In the foregoing embodiments, a current drawn from the acceleration power source 25 is passed to earth through the first-stage acceleration power source 22 and dividing resistors 32 and 33, resulting in such inconveniences as difficulty in incorporation of the first-stage acceleration power source 22 into the power supply unit and failure of passage of the electron beam to reach the specimen unless a high voltage is supplied from the acceleration power source 25. The embodiment of FIG. 5 can eliminate the inconvenience completely.

The FIG. 5 embodiment is featured, in the second place, in that when a minimum inside diameter of the first-stage acceleration electrode 12 at the inlet of electron beam is $D_1$, a minimum inside diameter thereof at the outlet is $D_2$, and the distance between the inlet and outlet is L, the first-stage acceleration electrode 12 is shaped into a configuration which satisfies the following relation:

$$4D_1 \leq D_2 \leq L \tag{1}$$

As well known in the art, power of an electrostatic lens formed within the multi-stage acceleration tube 1 is determined by an axial potential distribution. Power of an electrostatic lens formed corresponding to a portion of length l through which potential changes from $\Phi_o$ to $\Phi_i$ is indicated by $$\frac{1}{f} = \frac{3}{16}\left(\frac{\Phi_i}{\Phi_o}\right)^{\frac{1}{4}} \int_o^l \left(\frac{\Phi'}{\Phi}\right)^2 dz \tag{2}$$

where f represents a focal length of the lens and $\Phi'$ represents a differential coefficient of potential $\Phi$ in the z-direction. This equation clearly shows that when l is fixed, the lens power is strengthened at a position where $\Phi_i/\Phi_o$ is larger and at a position where the potential is smaller and its change rate $\Phi'$ is larger. Thus, in general, intensity of the electrostatic lens is substantially established between the field emission electrode 11 and the first-stage acceleration electrode 12. However, when the first-stage acceleration voltage $V_2$ is changed to a great extent, the potential distribution changes over a wide range. Namely, l in equation (2) varies to a great extent. Consequently, the lens power varies slightly. The above equation (1) expresses a condition necessary for minimizing the change of the lens power. The configuration meeting the equation (1) can provide, within the region of the first-stage acceleration electrode 12, a portion where the axial potential gradient can be substantially zeroed, thereby making it possible to confine the electrostatic lens power within a region between the portion and the field emission electrode 11. In other words, since the field emission voltage $V_1$ is interlocked with the first-stage acceleration voltage $V_2$, $(\Phi_i/\Phi_o)$ in equation (2) becomes constant and since the region of the lens power is limited, L and $(\Phi'/\Phi)$ in equation (2) become constant. For these reasons, the lens power can be made invariable. Therefore, the construction of FIG. 5 embodiment can keep constant the electron optics characteristics of the field emission type electron microscope using the multistage acceleration tube with higher accuracy than the construction of the other embodiments.

Figure 6:
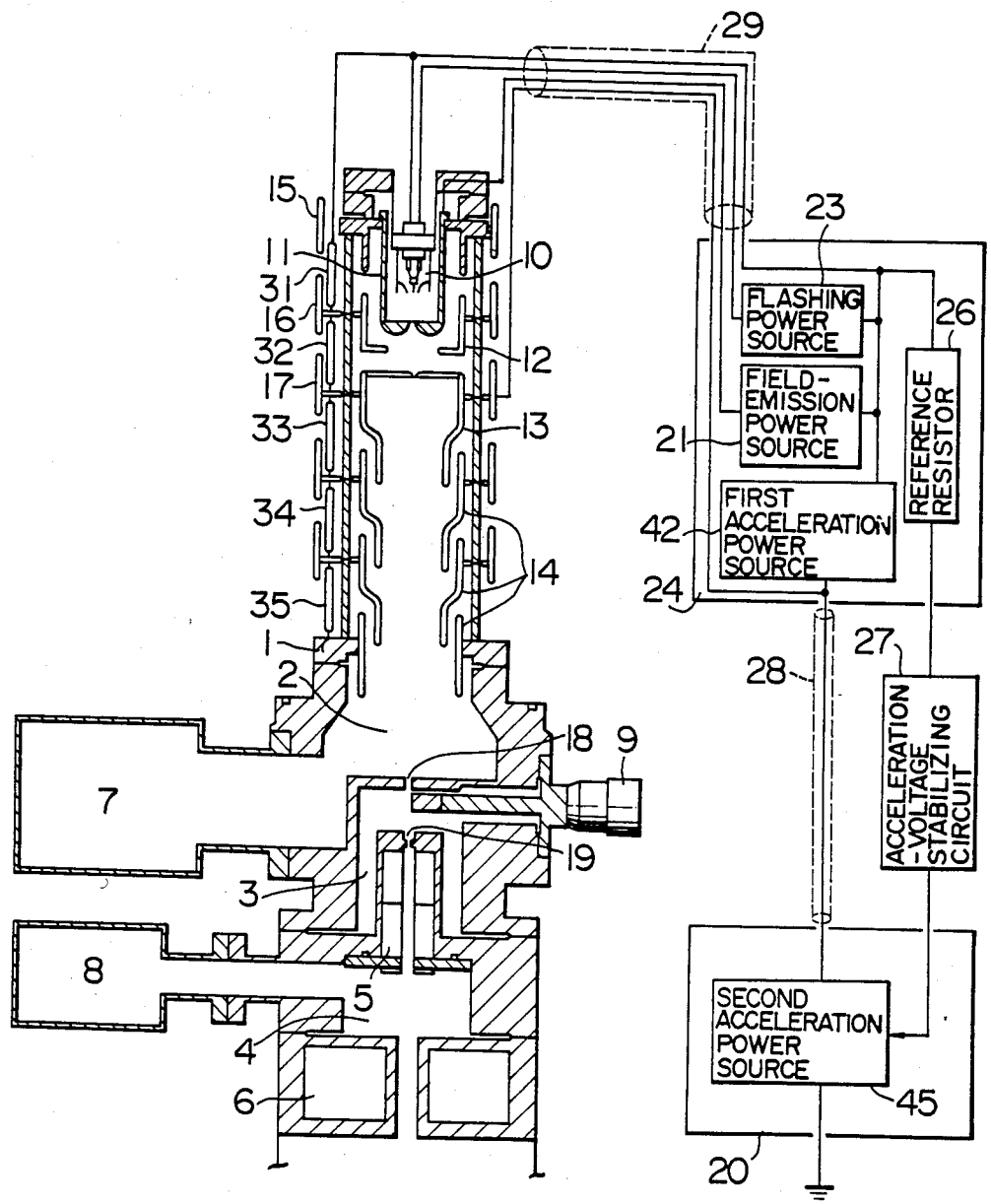

FIG. 6 shows a fifth embodiment of the invention. In this embodiment, when a multi-stage acceleration tube 1 is of a five-stage structure, a minimum inside diameter of a second-stage electrode acceleration electrode 13 at the inlet of electron beam is $D_1$, a minimum inside diameter thereof at the outlet is $D_2$, and the distance between the inlet and outlet is L, the second-stage acceleration electrode 13 is shaped into a configuration which satisfies the condition, $$4D_1 \leq D_2 \leq L.$$

In a power supply unit, a second acceleration power source 45 is connected in series with a first acceleration power source 42, and the total voltage, $V_0$, is applied to a field emission cathode 10 and a dividing resistor 31. The total voltage output is also negative fedback to the second acceleration power source 45 through a reference resistor 26 and an acceleration-voltage stabilizing circuit 27. A first acceleration voltage $V_{1st}$ is applied across the field emission cathode 10 and the second-stage acceleration electrode 13, and a divisional voltage proportional to a dividing ratio between dividing resistors 31 and 32 is applied to a first-stage acceleration electrode 12. As in the foregoing embodiments, the first acceleration power source 42 is interlocked with a field-emission power source 21 and hence, a change in the first acceleration voltage $V_{1st}$ caused in compliance with a change in a field emission voltage $V_1$ is negative fedback to the second acceleration power source 45 and compensated.

Under this condition, a first-stage acceleration voltage $V_2$ applied to the first-stage acceleration electrode 12 is given by $$V_2 = V_{1st} R_{31}/(R_{31} + R_{32}).$$

It is necessary that at least one of values of the first-stage acceleration voltage $V_2$ and first acceleration voltage $V_{1st}$ be 6 to 15 times the field emission voltage $V_1$. If the first-stage acceleration electrode 12 does not have a structure which substantially contributes to the lens power, it will be readily thought of that the ratio between the first acceleration voltage $V_{1st}$ and the field emission voltage $V_1$ may be $$V_{1st}/V_1 = 2 \times (6 \text{ to } 15).$$

According to the embodiment of FIG. 6, the electron optics characteristics of the electron gun can be kept constant even in a high voltage electron microscope of 200 KV or more, for example.

As has been described, according to the present invention, the electrooptical characteristics of the electron gun can be kept constant in the field emission type electron microscope using the multi-stage acceleration tube. Accordingly, with optimum conditions for brightness and alignment of axis once set, the invariable condition can be kept over a range of field emission voltage which is 5 times or more wider than that of the prior art, and easiness of operation, stability of performance and work efficiency can be improved drastically.

We claim:
1. A field emission type electron microscope using a multi-stage acceleration tube, comprising:
   a field emission cathode;
   a field emission electrode for causing field emission of electrons from said cathode, said field emission electrode having an aperture provided therein;
   acceleration electrode means including a first-stage acceleration electrode and at least one succeeding-stage acceleration electrode for accelerating an electron beam passing through said aperture of said field emission electrode; and
   application voltage interlocking means for changing, an acceleration voltage to be applied across said field emission cathode and at least one acceleration electrode of said acceleration electrode means inclusive of said first-stage acceleration electrode, in interlocked relationship with a change in a field emission voltage to be applied across said field emission cathode and said field emission electrode, said application voltage interlocking means interlocking said acceleration voltage with said field emission voltage so as to provide a ratio of said acceleration voltage to said field emission voltage in a range of 6 to 15.

2. The electron microscope according to claim 1, wherein said application voltage interlocking means comprises a first variable voltage source for supplying said field emission voltage and a second variable voltage source, for supplying said acceleration voltage.

3. The electron microscope according to claim 1, wherein said application voltage interlocking means supplies, as said field emission voltage and said acceleration voltage, divisional voltages generated by dividing a single power source by a series connection of resistors.

4. The electron microscope according to claim 1, wherein said first-stage acceleration electrode is shaped into a configuration which satisfies a relation of $$4D_1 \leq D_2 \leq L$$

where $D_1$ is a minimum aperture size at the inlet of the electron beam, $D_2$ is a minimum aperture size at the outlet of the electron beam, and the distance as measured along the electron beam travelling direction between the inlet and outlet is L.

5. The electron microscope according to claim 1, wherein said application voltage interlocking means supplies to the respective acceleration electrodes of said acceleration electrode means divisional voltages generated by dividing a single acceleration power source by resistors whose resistances are variable.

6. The electron microscope according to claim 1, further comprising a first acceleration power source for supplying said acceleration voltage interlocked with said field emission voltage by means of said application voltage interlocking means, a second acceleration power source connected in series therewith, and means for negative feedback of the output of said first acceleration power source to said second acceleration power source.

* * * * *